(12) United States Patent
Ehara et al.

(10) Patent No.: US 10,236,199 B2
(45) Date of Patent: Mar. 19, 2019

(54) SUBSTRATE PROCESSING METHOD AND SUBSTRATE PROCESSING APPARATUS

(71) Applicant: CANON ANELVA CORPORATION, Kawasaki-shi (JP)

(72) Inventors: Kiyoshi Ehara, Hino (JP); Mitsuo Suzuki, Tokyo (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 303 days.

(21) Appl. No.: 15/171,652

(22) Filed: Jun. 2, 2016

(65) Prior Publication Data
US 2016/0276193 A1    Sep. 22, 2016

Related U.S. Application Data

(62) Division of application No. 13/329,985, filed on Dec. 19, 2011, now abandoned.

(30) Foreign Application Priority Data

Dec. 28, 2010  (JP) ................................. 2010-292112
Dec. 8, 2011   (JP) ................................. 2011-269375

(51) Int. Cl.
  *H01L 21/677*  (2006.01)
  *H01L 21/67*   (2006.01)
  (Continued)

(52) U.S. Cl.
  CPC .. *H01L 21/67745* (2013.01); *H01L 21/67167* (2013.01); *H01L 21/67196* (2013.01); *H01L 21/67393* (2013.01)

(58) Field of Classification Search
None
See application file for complete search history.

(56) References Cited

U.S. PATENT DOCUMENTS 7,491,662 B2     2/2009  Takano
2004/0048461 A1  3/2004  Chen et al.
(Continued)

FOREIGN PATENT DOCUMENTS

JP     10-50789 A    2/1998
JP   2004-153006 A   5/2004
(Continued)

OTHER PUBLICATIONS

Office Action dated Aug. 14, 2015 in Japanese Application No. 2011-269375 (3 pages).

*Primary Examiner* — Shamim Ahmed
(74) *Attorney, Agent, or Firm* — Venable LLP

(57) ABSTRACT

A substrate processing method comprises: an execution step of executing the first processing for the plurality of substrates, and executing the second processing for the substrates having undergone the first processing; a recovery step of recovering the plurality of substrates having undergone the first processing and the second processing to the retraction chamber; a conditioning step of, after completion of the first processing for the last substrate among the plurality of substrates, loading a dummy substrate into the first processing chamber, executing the third processing for the dummy substrate, and unloading the dummy substrate from the first processing chamber; and a second execution step of, after the dummy substrate is unloaded from the first processing chamber in the conditioning step, loading the substrates recovered in the recovery step into the first processing chamber, and executing the third processing for the substrates loaded into the first processing chamber.

3 Claims, 9 Drawing Sheets

(51) Int. Cl.
*C23F 1/12* (2006.01)
*H01L 21/673* (2006.01)

(56) References Cited

U.S. PATENT DOCUMENTS

| | | | |
|---|---|---|---|
| 2005/0233477 A1* | 10/2005 | Yamazaki | H01J 37/32935 438/5 |
| 2007/0184636 A1* | 8/2007 | Takano | H01L 21/67745 438/476 |
| 2008/0125899 A1 | 5/2008 | Numakura | |
| 2008/0171435 A1* | 7/2008 | Fujii | C23C 14/568 438/680 |
| 2009/0142168 A1 | 6/2009 | Takano | |
| 2009/0229635 A1 | 9/2009 | Numakura et al. | |
| 2009/0269171 A1* | 10/2009 | Iijima | H01L 21/67253 414/222.01 |
| 2010/0102030 A1 | 4/2010 | Kondoh | |
| 2010/0226737 A1* | 9/2010 | Sakaue | H01L 21/67766 414/217.1 |

FOREIGN PATENT DOCUMENTS

| | | |
|---|---|---|
| JP | 2004-153185 A | 5/2004 |
| JP | 2009-135542 A | 6/2009 |

\* cited by examiner

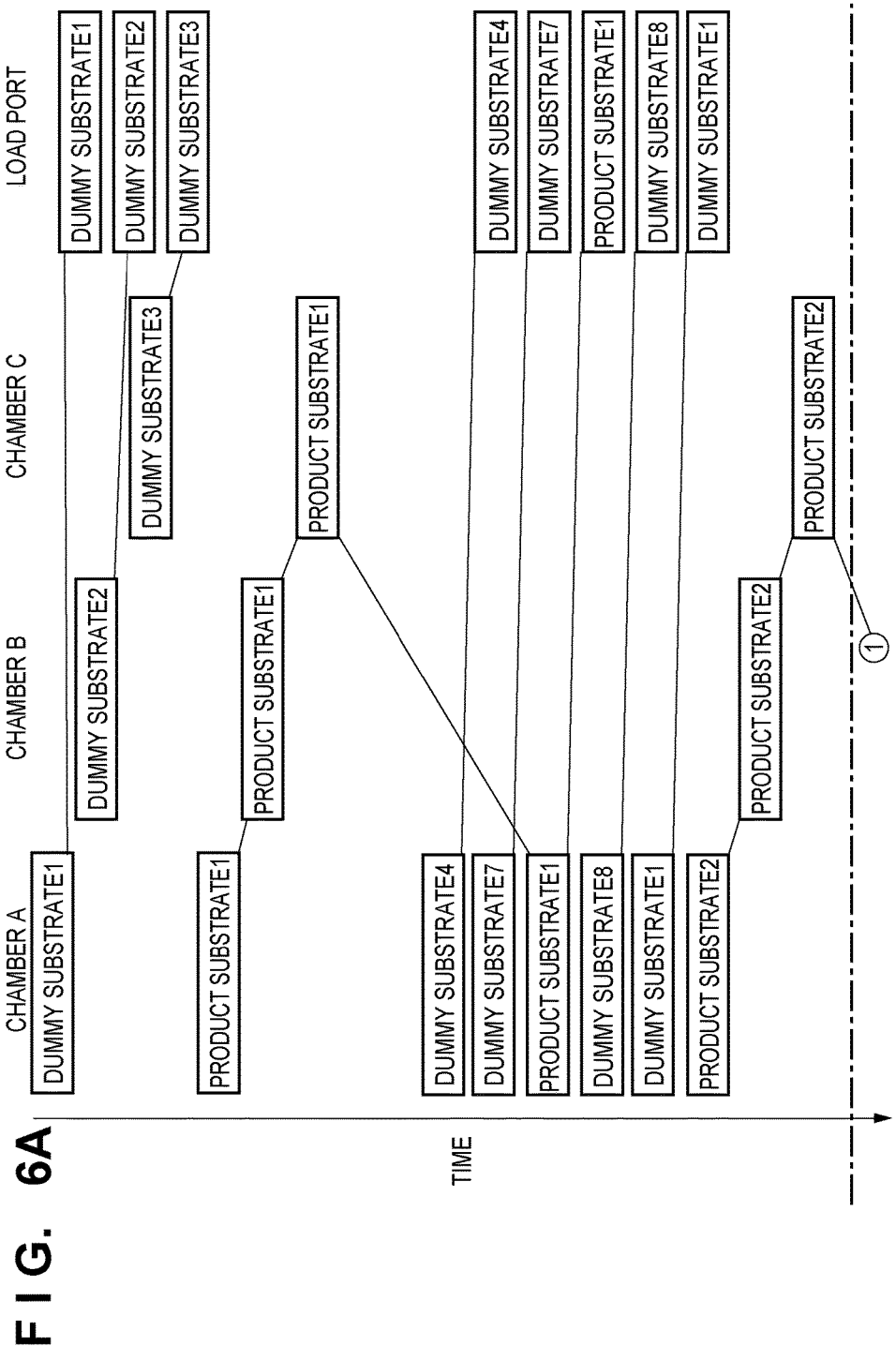

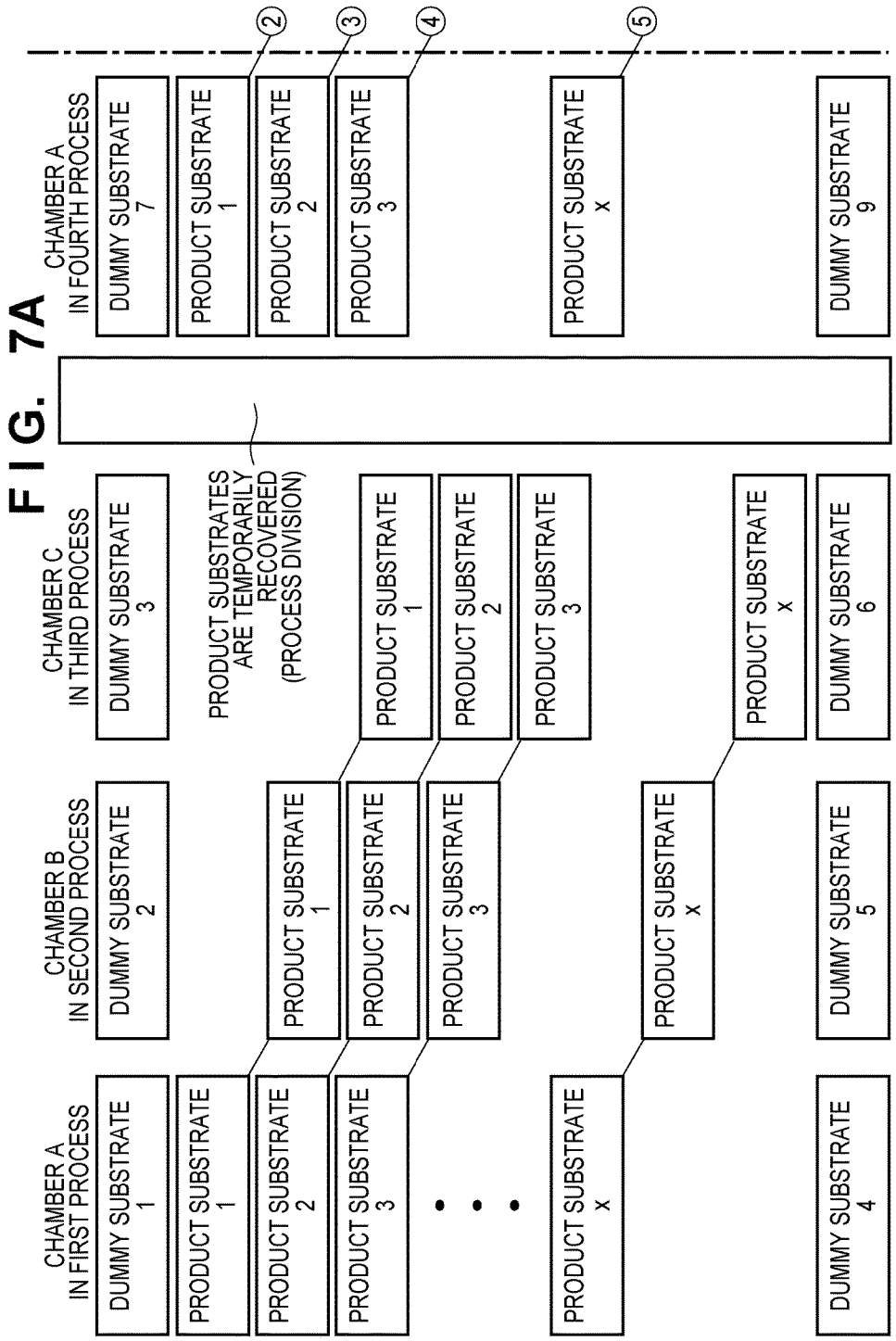

SUBSTRATE PROCESSING METHOD AND SUBSTRATE PROCESSING APPARATUS

CROSS-REFERENCE TO RELATED APPLICATIONS

This application is a divisional application of U.S. patent application Ser. No. 13/329,985, filed Dec. 19, 2011, which claims the benefit of Japanese Patent Application No. 2010-292112, filed Dec. 28, 2010 and Japanese Patent Application No. 2011-269375, filed Dec. 8, 2011. The contents of the aforementioned applications are incorporated herein by reference in their entireties.

BACKGROUND OF THE INVENTION

Field of the Invention

The present invention relates to a substrate processing method and substrate processing apparatus which can shorten the processing time.

Description of the Related Art

A substrate processing apparatus performs processing using dummy substrates to condition the atmosphere in each chamber before and after processing a product substrate. When, for example, a plurality of product substrates are processed in each chamber in the order of chamber A→chamber B→chamber C, the same processing is repeated for each chamber. Thus, processing of transporting dummy substrates to condition the atmosphere is performed for each chamber before the first product substrate is processed and after the last product substrate is processed. Note that Japanese Patent Laid-Open No. 2004-153185, for example, gives an example of such processing of conditioning the atmosphere using dummy substrates.

However, product substrates are often processed (their return processing is often performed) using the same chamber by a plurality of times under different conditions.

Assume that product substrates are processed in each chamber in the order of, for example, chamber A (first process)→chamber B (second process)→chamber C (third process)→chamber A (fourth process). In this case, return processing is often performed so that product substrates are processed in chamber A in the first process, and processed in chamber A again in the fourth process. In such return processing, when different types of processing are to be performed in the first and fourth processes, processing which uses dummy substrates is necessary to condition the atmosphere in chamber A before and after each of the first and fourth processes.

If return processing is used as in this case, when dummy substrate processing for conditioning the atmosphere in chamber A is executed for each product substrate, the number of dummy substrates increases, thus degrading the processing efficiency.

It is an object of the present invention to provide a substrate processing technique which reduces the number of times of wasteful dummy substrate processing even if return processing is necessary in product substrate processing, and is therefore excellent in processing efficiency.

SUMMARY OF THE INVENTION

According to one aspect of the present invention, there is provided a substrate processing method of using a substrate processing apparatus including at least a first processing chamber, a second processing chamber, and a retraction chamber to execute, for a plurality of substrates, a series of processing including first processing of processing a substrate in the first processing chamber, second processing of processing the substrate in the second processing chamber after the first processing, and third processing of performing processing, different from the first processing, for the substrate in the first processing chamber after the second processing, comprising: an execution step of executing the first processing for the plurality of substrates, and executing the second processing for the substrates having undergone the first processing; a recovery step of recovering the plurality of substrates having undergone the first processing and the second processing to the retraction chamber; a conditioning step of, after completion of the first processing for the last substrate among the plurality of substrates, loading a dummy substrate into the first processing chamber, executing the third processing for the dummy substrate, and unloading the dummy substrate from the first processing chamber; and a second execution step of, after the dummy substrate is unloaded from the first processing chamber in the conditioning step, loading the substrates recovered in the recovery step into the first processing chamber, and executing the third processing for the substrates loaded into the first processing chamber.

According to another aspect of the present invention, there is provided a substrate processing apparatus which includes at least a first processing chamber, a second processing chamber, a retraction chamber, a transport unit configured to transport a substrate, and a control unit configured to control the first processing chamber, the second processing chamber, and the transport unit, and executes, for a plurality of substrates, a series of processing including first processing of processing a substrate in the first processing chamber, second processing of processing the substrate in the second processing chamber after the first processing, and third processing of performing processing, different from the first processing, for the substrate in the first processing chamber after the second processing, wherein the control unit comprises: a processing chamber control unit configured to control the first processing chamber to execute the first processing for the plurality of substrates, and control the second processing chamber to execute the second processing for the substrates having undergone the first processing; and a transport control unit which controls the transport unit to execute processing of recovering the substrates having undergone the first processing and the second processing into the retraction chamber after execution of the second processing, and controls the transport unit to load a dummy substrate into the first processing chamber after completion of the first processing for the last substrate among the plurality of substrates, and wherein the processing chamber control unit controls the first processing chamber to execute the third processing for the dummy substrate after the dummy substrate is loaded into the first processing chamber, the transport control unit controls the transport unit to execute processing of unloading the dummy substrate from the first processing chamber after completion of the third processing for the dummy substrate, and controls the transport unit to load the recovered substrate into the first processing chamber after the dummy substrate is unloaded from the first processing chamber, and the processing chamber control unit controls the first processing chamber to execute the third processing after the recovered substrate is loaded into the first processing chamber.

According to the present invention, it is possible to provide a substrate processing technique which reduces the number of times of wasteful dummy substrate processing even if return processing is necessary in product substrate processing, and is therefore excellent in processing efficiency.

Further features of the present invention will become apparent from the following description of exemplary embodiments with reference to the attached drawings.

BRIEF DESCRIPTION OF THE DRAWINGS

FIGS. 6A and 6B are flowcharts of processing of three product substrates in each chamber in the order of chamber A→chamber B→chamber C→chamber A using a method according to a Comparative Example; and FIGS. 7A and 7B are views showing Example 2 of product substrate processing, dummy substrate processing, and process division when product substrates are processed in each chamber in the order of chamber A→chamber B→chamber C→chamber A→chamber B→chamber A.

DESCRIPTION OF THE EMBODIMENTS

Figure 1:
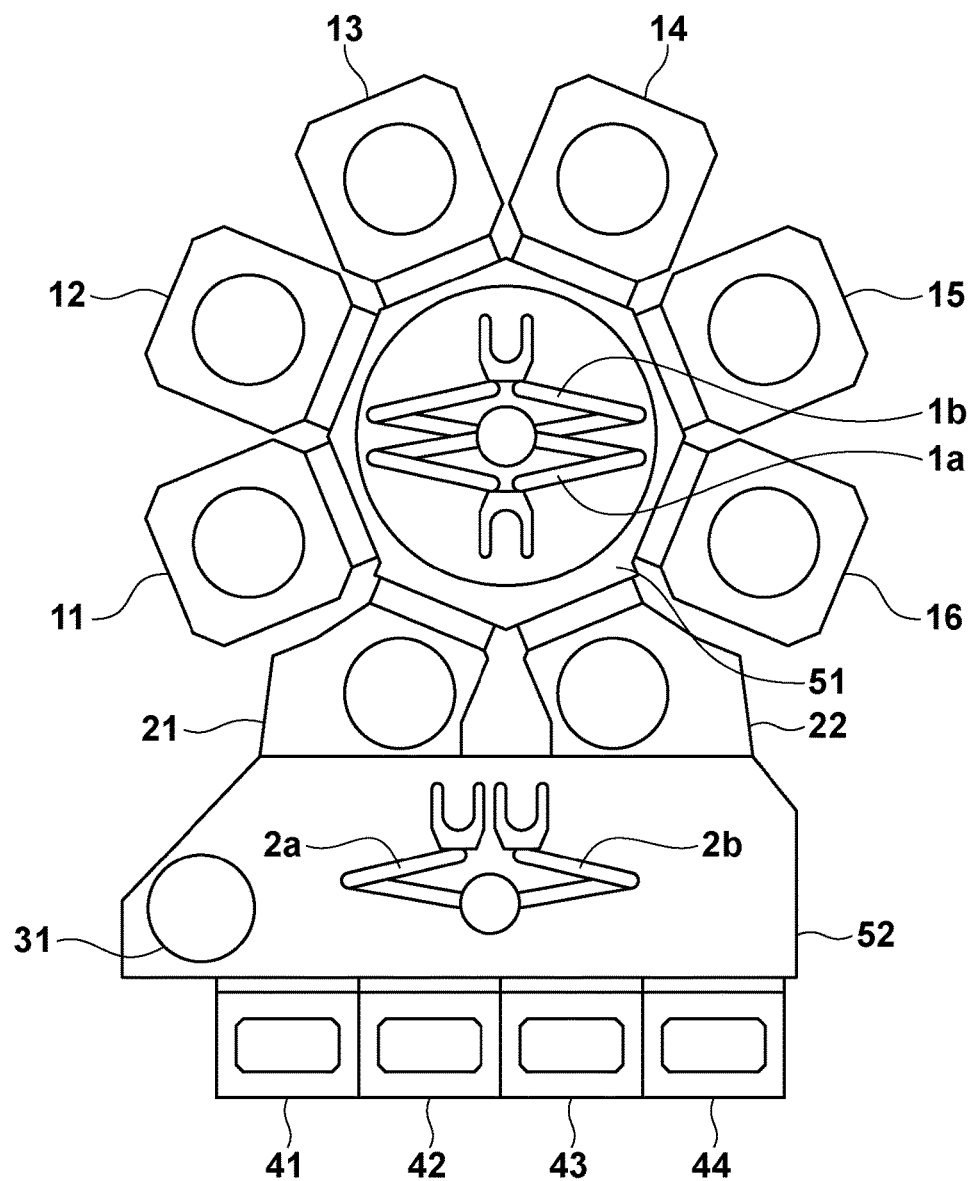
FIG. 1 is an explanatory diagram schematically showing a semiconductor manufacturing apparatus to which the present invention is applicable.

FIG. 1 is a diagram for explaining the configuration of a semiconductor manufacturing apparatus applicable to the present invention. This apparatus serves as a cluster tool apparatus. A transport chamber 51 of the apparatus includes transport robot arms 1a and 1b that serve as a transport mechanism. Processing chambers 11, 12, 13, 14, 15, and 16 and load lock chambers 21 and 22 are connected to each other around the transport chamber 51. The processing chambers 11, 12, 13, 14, 15, and 16 are used to form predetermined films on the surface of a substrate. The load lock chambers 21 and 22 are used to temporarily store substrates in transporting the substrates between the atmospheric air side and the processing chambers 11, 12, 13, 14, 15, and 16. Note that each processing chamber may be, for example, a deposition chamber which performs deposition processing on a substrate by, for example, PVD or CVD, an etching chamber, a heating chamber, or a cooling chamber.

The transport chamber 51 has a polygonal column shape, as shown in FIG. 1, and has its side surfaces airtightly connected to the two load lock chambers 21 and 22 and processing chambers 11, 12, 13, 14, 15, and 16 via gate valves. Each of the processing chambers 11, 12, 13, 14, 15, and 16 is a vacuum chamber including an exhaust system.

Each of the load lock chambers 21 and 22 is provided with a cassette capable of storing a predetermined number of substrates. Load ports 41, 42, 43, and 44 and auto-loaders 2a and 2b are provided outside the load lock chambers 21 and 22, as shown in FIG. 1. The load ports 41, 42, and 43 are arranged on the atmospheric air side and store product substrates. The load port 44 stores dummy substrates. The auto-loaders 2a and 2b transport substrates between the load lock chambers 21 and 22.

The transport robot arms 1a and 1b provided in the transport chamber 51 can pick up, one by one from the load lock chambers 21 and 22, substrates on which films are to be deposited, and transport them to the processing chamber 11. Also, the transport robot arms 1a and 1b recover, from the processing chamber 11, the substrates on which films have been deposited, and return them to the load lock chambers 21 and 22. Each of the transport robot arms 1a and 1b includes a blade (substrate holding portion) which mounts and holds a substrate on its upper surface, an articulated arm having a distal end at which this blade is fixed, and a driving system which drives this articulated arm. The driving system often adopts a configuration which rotates the articulated arm about the central axis of the transport chamber 51, or rectilinearly moves the overall articulated arm.

Figure 2:
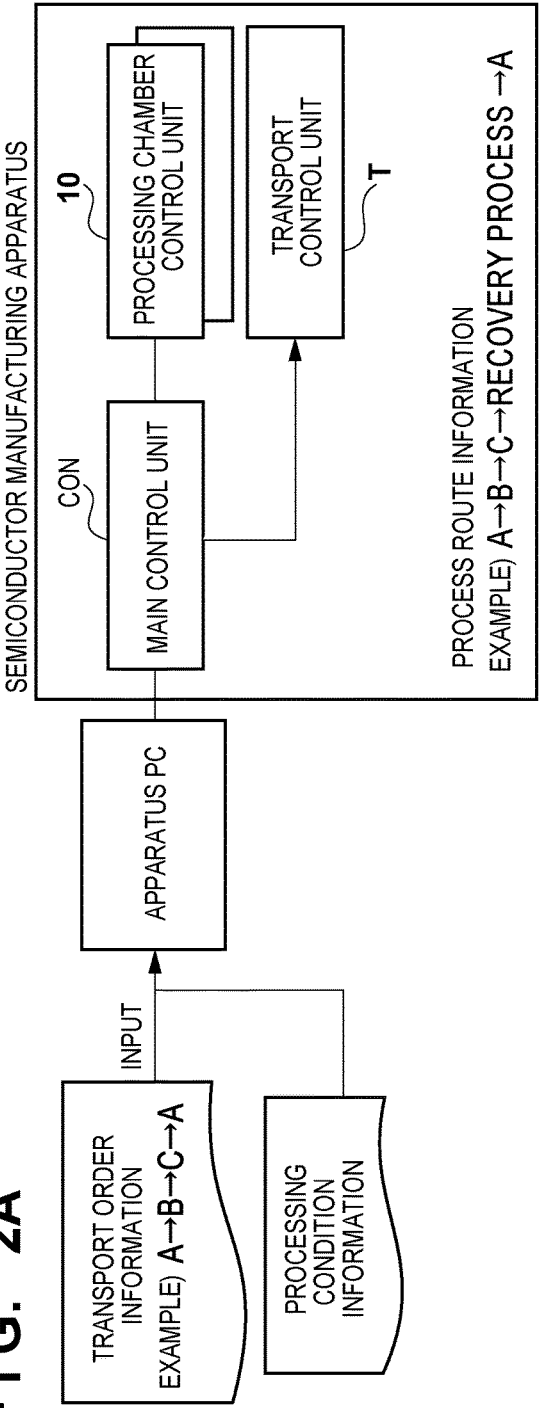
FIGS. 2A and 2B are a block diagram and a table, respectively, showing the configuration of a control system for the semiconductor manufacturing apparatus and a process route information generation device.

FIGS. 2A and 2B show functional blocks of an example of a control system for the above-mentioned semiconductor manufacturing apparatus. The control system includes a main control unit CON which controls the operation of the overall apparatus, a processing chamber control unit 10 which controls constituent elements (for example, an exhaust unit, a plasma generation unit, and a gas introduction unit) of each of the processing chambers 11, 12, 13, 14, 15, and 16 to execute predetermined processing, and a transport control unit T which controls the operations of the transport robot arms 1a, 1b, 2a, and 2b. These control units can communicate with each other, and include, for example, PCs or PLCs having a storage function and an arithmetic function with which a program can be executed. When an apparatus PC accepts input of transport order information (A→B→C→A in this Example) and processing condition information by the user, the transport order information and processing condition information are stored in the storage device of the main control unit CON. The main control unit CON can execute substrate processing by controlling, for example, the transport control unit T and processing chamber control unit 10 based on the transport order information and processing condition information stored in the storage device. Note that the main control unit CON corresponds to a process route information generation device in the present invention, and generates process route information based on transport order information and processing condition information input via the apparatus PC serving as a user I/F. The transport order information specifies, for example, the order in which substrates are transported into a plurality of processing chambers to process the substrates in the plurality of processing chambers, as shown in FIG. 2A. Also, the processing condition information specifies the substrate processing conditions in each processing chamber, as shown in FIG. 2B. The process route information specifies the substrate transport route, including a recovery process of retracting substrates into a retraction chamber in a series of substrate processing in the plurality of processing chambers, based on the transport order information and processing condition information. As the retraction chamber, the load port 41, 42, or 43 which stores product substrates can be used, or the load lock chamber 21 or 22 can be used when the load lock chamber 21 or 22 can store a plurality of substrates.

Figure 3:
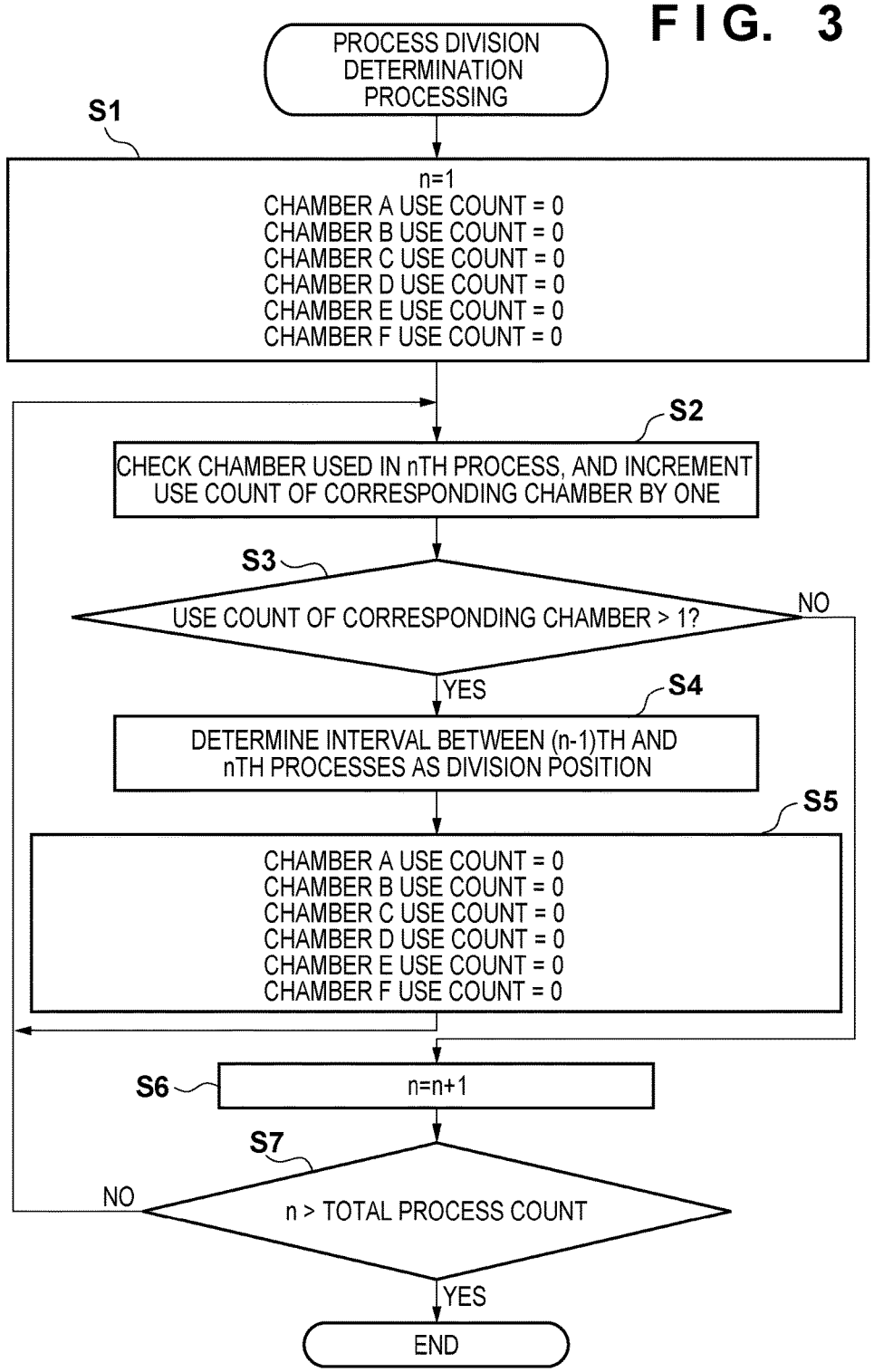
FIG. 3 is a flowchart showing process division determination processing.
Figure 4:
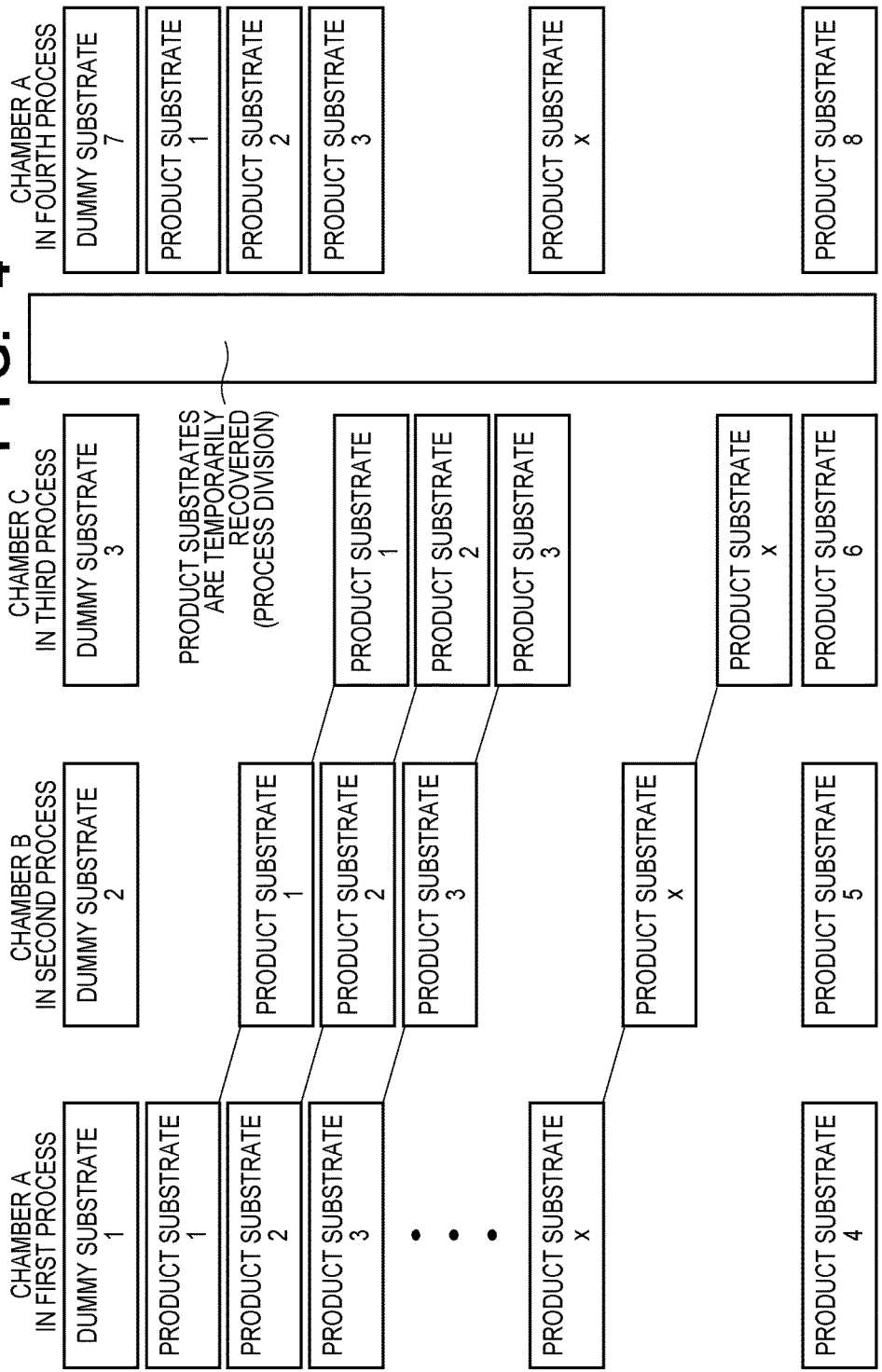
FIG. 4 is a view showing Example 1 of product substrate processing, dummy substrate processing, and process division when x product substrates are processed in each chamber in the order of chamber A→chamber B→chamber C→chamber A.

Process division determination processing will be described next with reference to FIGS. 3 and 4. FIG. 3 is a flowchart of process division determination processing. FIG. 4 shows an Example of product substrate processing, control processing which uses dummy substrates, and process division when x product substrates are processed in each chamber in the order of chamber A→chamber B→chamber C→chamber A. Note that the sequence processing shown in FIG. 3 is executed by the main control unit CON shown in FIG. 2A.

First, in step S1, the main control unit CON initializes the process count n for checking a chamber used, and a storage device which stores the use count of each chamber. In step S2, the main control unit CON refers to the transport order information (chamber A→chamber B→chamber C→chamber A in this Example) stored in the storage device of the main control unit CON to check a chamber used in the nth process, thereby determining the use count of this chamber. In step S3, the main control unit CON determines whether the use count of the corresponding chamber is larger than one. If the use count of the corresponding chamber is larger than one, that is, if Yes is determined in step S3, the main control unit CON sets the interval between the (n−1)th and nth processes as a process division position in step S4. When one process division position is determined, in step S5 the main control unit CON initializes the storage device which stores the use count of each chamber, and returns to step S2, in which it advances determination of process division positions for the processes subsequent to the nth process.

On the other hand, if it is determined in step S3 that the use count of the corresponding chamber is one, in step S6 the main control unit CON increments the process count from n to n+1, and advances the process to the next step. If it is determined in step S7 that the process count n is equal to or smaller than the total process count (No in step S7), the main control unit CON returns the process to step S2, in which it continues the process division determination processing. On the other hand, if it is determined in step S7 that the process count n is larger than the total process count (Yes in step S7), the main control unit CON ends the process division determination processing. With this processing, a process division position is automatically calculated so the same chamber is not repeatedly used, as shown in FIG. 4, within the range of the divided process. In the example shown in FIG. 4, the process is divided in the interval between the third and fourth processes.

Example 1

Figure 5:
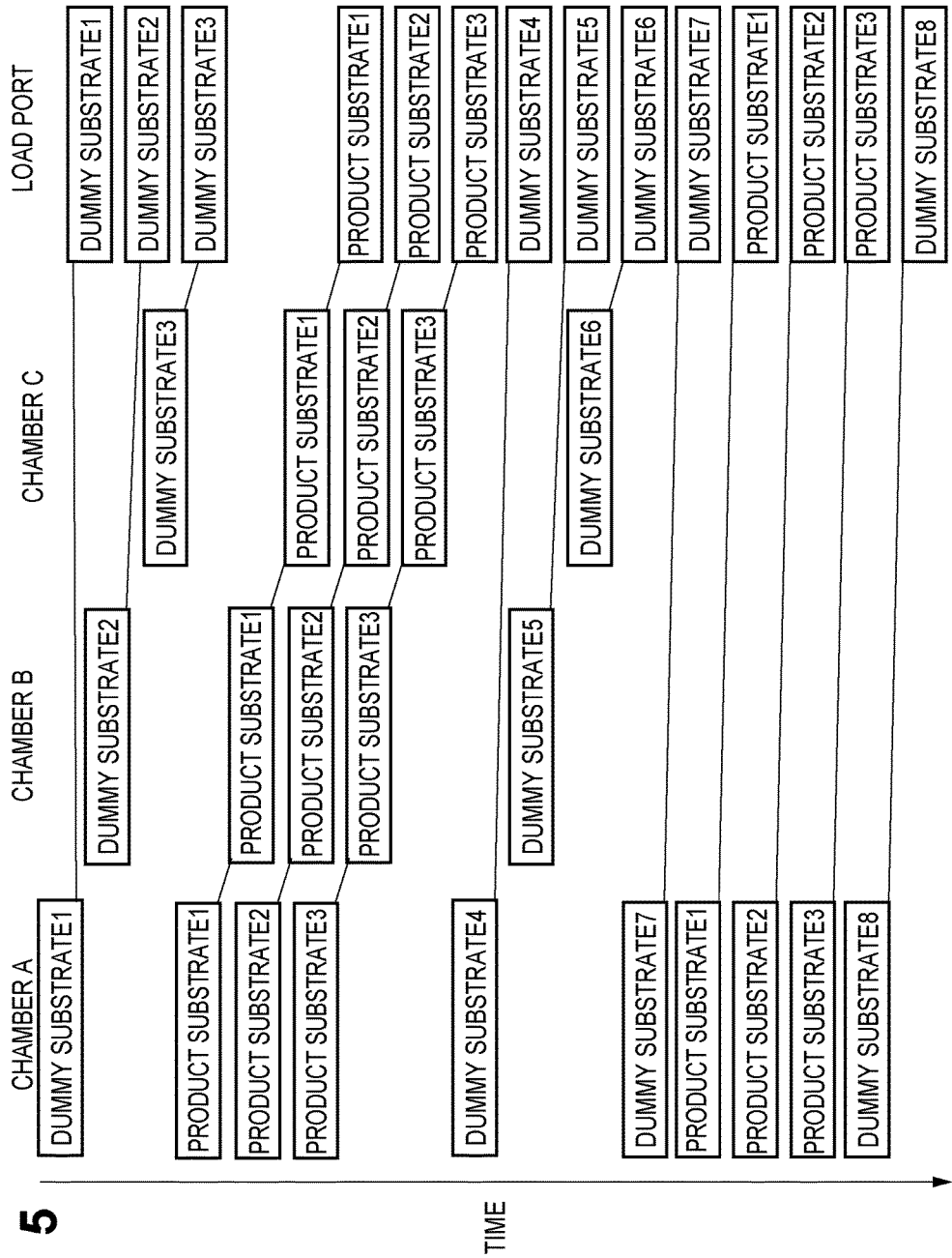
FIG. 5 is a flowchart of processing of three product substrates in each chamber in the order of chamber A→chamber B→chamber C→chamber A according to the present invention.

Example 1 will be described with reference to FIGS. 1 to 5. FIG. 5 is a flowchart of processing of three product substrates in each chamber in the order of chamber A→chamber B→chamber C→chamber A according to the present invention. Although three product substrates are used in this Example, the scope of the present invention is not limited to this as long as two or more product substrates are used.

At the start of product substrate processing, the main control unit CON performs the process division determination processing shown in FIG. 3 to calculate a process division position. With this process division determination processing, the process is divided in the interval between the third and fourth processes, as shown in FIG. 4, when product substrates are processed in each chamber in the order of chamber A→chamber B→chamber C→chamber A. After calculating a process division position, the main control unit CON advances substrate processing.

The main control unit CON drives the substrate transport robot arm 2a or 2b shown in FIG. 1 to unload dummy substrate 1 from the load port 44 shown in FIG. 1. The main control unit CON loads unloaded dummy substrate 1 into the load lock chamber 21 or 22, shown in FIG. 1, via an aligner 31 shown in FIG. 1, and then reduces the pressure in the load lock chamber 21 or 22 into which dummy substrate 1 is loaded. Dummy substrate 1 is unloaded by the substrate transport robot arm 1a or 1b shown in FIG. 1, and loaded into the processing chamber 11 (chamber A) shown in FIG. 1, and then the first process starts. After completion of processing in chamber A, dummy substrate 1 is unloaded from the processing chamber 11 shown in FIG. 1, and returned to the original position in the load port 44 shown in FIG. 1. Similarly, the second process is executed for dummy substrate 2 in the processing chamber 12 (chamber B) shown in FIG. 1, and the third process is executed for dummy substrate 3 in the processing chamber 13 (chamber C) shown in FIG. 1.

The main control unit CON drives the substrate transport robot arm 2a or 2b to unload product substrate 1 from the load port 41, 42, or 43, and load it into the load lock chamber 21 or 22, shown in FIG. 1, via the aligner 31, and then reduces the pressure in the load lock chamber 21 or 22 into which product substrate 1 is loaded. Product substrate 1 is unloaded by the substrate transport robot arm 1a or 1b shown in FIG. 1, and loaded into the processing chamber 11 shown in FIG. 1, and then processing in chamber A (first process) starts. After completion of processing in chamber A (first process), product substrate 1 is unloaded by the substrate transport robot arm 1a or 1b shown in FIG. 1, and loaded into the processing chamber 12, and then processing in chamber B (second process) starts. After completion of processing in chamber B (second process), product substrate 1 is unloaded by the substrate transport robot arm 1a or 1b shown in FIG. 1, and loaded into the processing chamber 13, and then processing in chamber C (third process) starts. After completion of processing in chamber C (third process), product substrate 1 is unloaded from the processing chamber 13 shown in FIG. 1, and returned to the original position in the load port 41, 42, or 43 shown in FIG. 1. Product substrates 2 and 3 are similarly processed up to the third process, and returned to the original positions in the load ports among the load ports 41 to 43 (retraction chambers) shown in FIG. 1. As described above, in the present invention, three product substrates are processed in each chamber in the order of A→B→C first.

Next, processing (fourth process) different from the first processing (first process) is executed in chamber A. The processing different from the first processing is, for example, deposition or etching processing, and is performed under conditions different from those of the first processing in the same chamber, so the atmosphere in this chamber must be conditioned. Prior to conditioning the atmosphere, in the case of, for example, deposition, a dummy substrate must be placed on a substrate holder so no film adheres to the substrate holder. In the case of etching as well, a dummy substrate must be placed on a substrate holder so no film adheres to the substrate holder.

Hence, in this case, dummy substrate processing is executed as a preparation process (conditioning process) for executing the processing (fourth process) different from the first processing. A dummy substrate can be loaded at any timing as long as this is done after processing of the third, that is, last product substrate is completed.

More specifically, the main control unit CON actuates the substrate transport robot arm 2a or 2b to unload dummy substrate 4 from the load port 44, and load it into the load lock chamber 21 or 22 via the aligner 31, and then reduces the pressure in the load lock chamber 21 or 22 into which dummy substrate 4 is loaded. Dummy substrate 4 is unloaded by the substrate transport robot arm 1*a* or 1*b* shown in FIG. 1, and loaded into the processing chamber 11 shown in FIG. 1, and then processing in chamber A (fourth process) starts. After completion of processing in chamber A (fourth process), dummy substrate 4 is unloaded from the processing chamber 11, and returned to the load port 44. Similarly, processing in chamber B (fifth process) is executed for dummy substrate 5 in the processing chamber 12 shown in FIG. 1, and processing in chamber C (sixth process) is executed for dummy substrate 6 in the processing chamber 13 shown in FIG. 1.

The main control unit CON actuates the substrate transport robot arm 2*a* or 2*b* to unload dummy substrate 7 from the load port 44, and load it into the load lock chamber 21 or 22 via the aligner 31, and then reduces the pressure in the load lock chamber 21 or 22 into which dummy substrate 7 is loaded. Dummy substrate 7 is unloaded by the substrate transport robot arm 1*a* or 1*b*, and loaded into the processing chamber 11, and then processing in chamber A starts. After completion of processing in chamber A, dummy substrate 7 is unloaded from the processing chamber 11, and returned to the load port 44 shown in FIG. 1.

Next, processing in chamber A, that is, the first process, processing in chamber B, that is, the second process, and processing in chamber C, that is, the third process are executed, and the fourth process different from the first process is executed for three, temporarily retracted product substrates 1, 2, and 3 in chamber A. That is, the main control unit CON actuates the substrate transport robot arm 2*a* or 2*b* to unload product substrate 1 from the load port 41, 42, or 43, and load it into the load lock chamber 21 or 22 via the aligner 31, and then reduces the pressure in the load lock chamber 21 or 22 into which product substrate 1 is loaded. Product substrate 1 loaded into the load lock chamber 21 or 22 is unloaded by the substrate transport robot arm 1*a* or 1*b* shown in FIG. 1, and loaded into the processing chamber 11 shown in FIG. 1, and then processing in chamber A (fourth process) starts. After completion of processing in chamber A (fourth process), product substrate 1 is unloaded from the processing chamber 11 shown in FIG. 1, and returned to the original position in the load port among the load ports 41 to 43 shown in FIG. 1. Similarly, the fourth process is executed for product substrates 2 and 3 in chamber A, and these product substrates 2 and 3 are returned to the original positions in the load ports among the load ports 41 to 43 shown in FIG. 1.

The main control unit CON actuates the substrate transport robot arm 2*a* or 2*b* to unload dummy substrate 8 from the load port 44, and load it into the load lock chamber 21 or 22 via the aligner 31, and then reduces the pressure in the load lock chamber 21 or 22 into which dummy substrate 8 is loaded. Dummy substrate 8 is unloaded by the substrate transport robot arm 1*a* or 1*b*, and loaded into the processing chamber 11, and then processing in chamber A starts. After completion of processing in chamber A, dummy substrate 8 is unloaded from the processing chamber 11, and returned to the load port 44.

As described above, according to the present invention, when return processing is necessary, a plurality of product substrates are processed up to a process precedent to the return processing, and dummy substrates are processed before and after this processing. This makes it possible to reduce the number of dummy substrates to be processed, thus improving the processing efficiency.

Figure 6B:
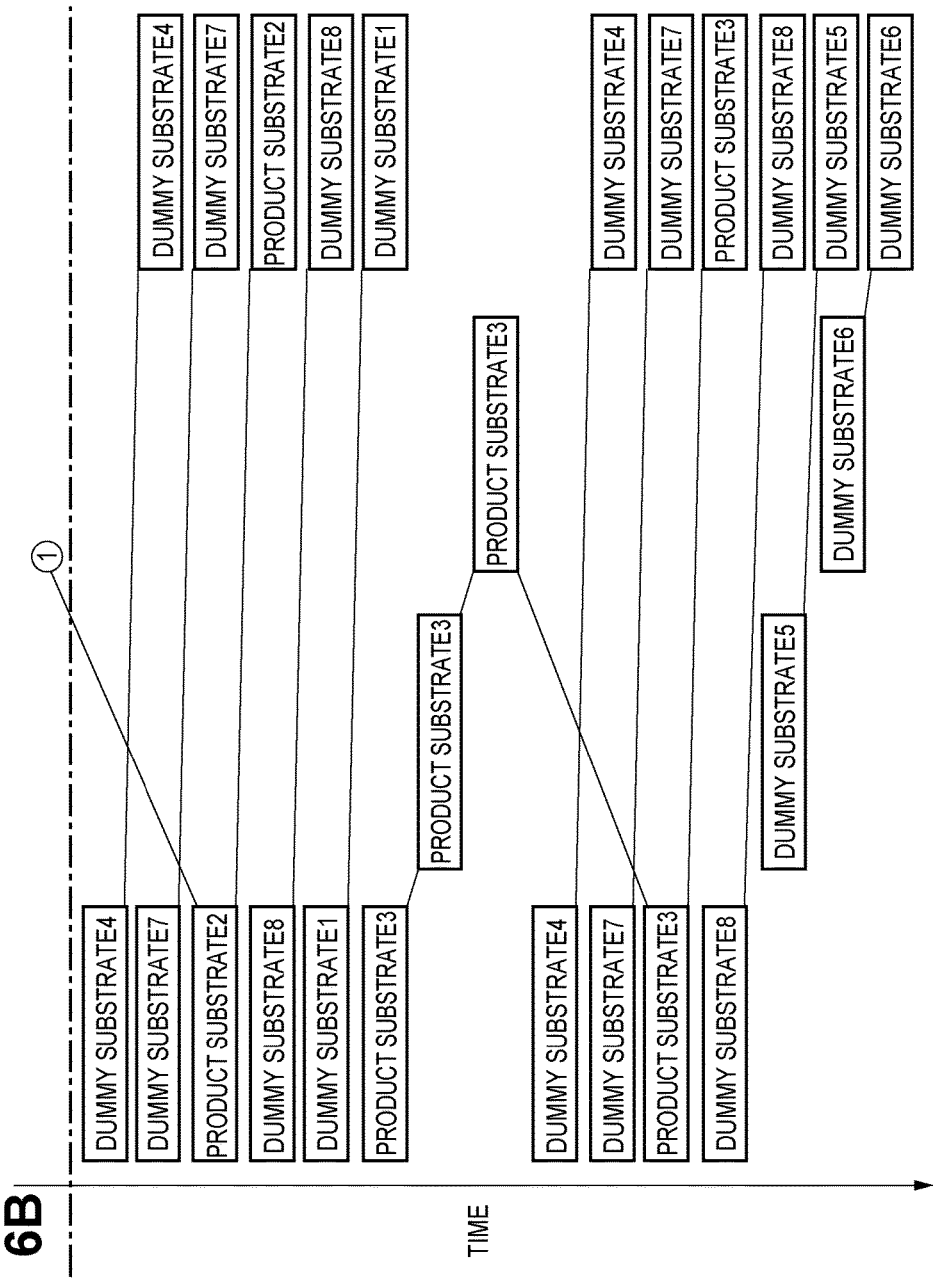

For the sake of comparison, a substrate processing method according to a Comparative Example will be described below with reference to FIGS. 6A and 6B. FIGS. 6A and 6B are flowcharts for explaining a sequence of processing three product substrates in each chamber in the order of chamber A→chamber B→chamber C→chamber A using a method according to the Comparative Example.

In this method, first, the main control unit CON drives the substrate transport robot arm 2*a* or 2*b* to unload dummy substrate 1 from the load port 44. The main control unit CON loads unloaded dummy substrate 1 into the load lock chamber 21 or 22 via the aligner 31, and then reduces the pressure in the load lock chamber 21 or 22 into which dummy substrate 1 is loaded. Dummy substrate 1 is unloaded by the substrate transport robot arm 1*a* or 1*b*, and loaded into the processing chamber 11 (chamber A), and then the first process starts. After completion of processing in chamber A, dummy substrate 1 is unloaded from the processing chamber 11, and returned to the original position in the load port 44. Similarly, the second process is executed for dummy substrate 2 in the processing chamber 12 (chamber B), and the third process is executed for dummy substrate 3 in the processing chamber 13 (chamber C).

The main control unit CON processes product substrate 1 in each chamber in the order of chamber A→chamber B→chamber C, and processes dummy substrates 4 and 7 in chamber A. The main control unit CON drives the substrate transport robot arm 2*a* or 2*b* to load product substrate 1 from chamber C into chamber A, and performs processing, different from the first processing in chamber A, for product substrate 1 in chamber A. The main control unit CON processes dummy substrates 8 and 1 in chamber A.

The main control unit CON processes product substrate 2 in each chamber in the order of chamber A→chamber B→chamber C, and processes dummy substrates 4 and 7 in chamber A. The main control unit CON drives the substrate transport robot arm 2*a* or 2*b* to load product substrate 2 from chamber C into chamber A, and performs processing, different from the first processing in chamber A, for product substrate 2 in chamber A. The main control unit CON processes dummy substrates 8 and 1 in chamber A.

The main control unit CON processes product substrate 3 in each chamber in the order of chamber A→chamber B→chamber C, and processes dummy substrates 4 and 7 in chamber A. The main control unit CON drives the substrate transport robot arm 2*a* or 2*b* to load product substrate 3 from chamber C into chamber A, and performs processing, different from the first processing in chamber A, for product substrate 3 in chamber A.

Dummy substrate 8 is unloaded by the substrate transport robot arm 1*a* or 1*b*, and loaded into the processing chamber 11 (chamber A), and then the first process starts. After completion of processing in chamber A, dummy substrate 8 is unloaded from the processing chamber 11, and returned to the original position in the load port 44. Similarly, the second process is executed for dummy substrate 5 in the processing chamber 12 (chamber B), and the third process is executed for dummy substrate 6 in the processing chamber 13 (chamber C).

In this manner, in the substrate processing method according to the Comparative Example, when return processing is necessary, dummy substrate processing is executed for each product substrate. This increases the number of dummy substrates to be processed, thus degrading the processing efficiency, compared to the substrate processing according to the present invention.

As described above, according to the present invention, when return processing is necessary, a plurality of product substrates are processed up to a process precedent to the return processing, and dummy substrates are processed before and after this processing. This makes it possible to reduce the number of dummy substrates to be processed, thus greatly improving the processing efficiency, compared to the conventional method.

Note that the time in which processing which uses a dummy substrate is performed is not always limited to the above-mentioned time, and the present invention is also applicable when, for example, conditioning processing which uses a dummy substrate is performed immediately after completion of the first process. As shown in FIG. 4, when the present invention is applied, chambers which require return processing are used while being kept idle only for a short period of time, thus improving the processing efficiency.

Example 2

Figure 7B:
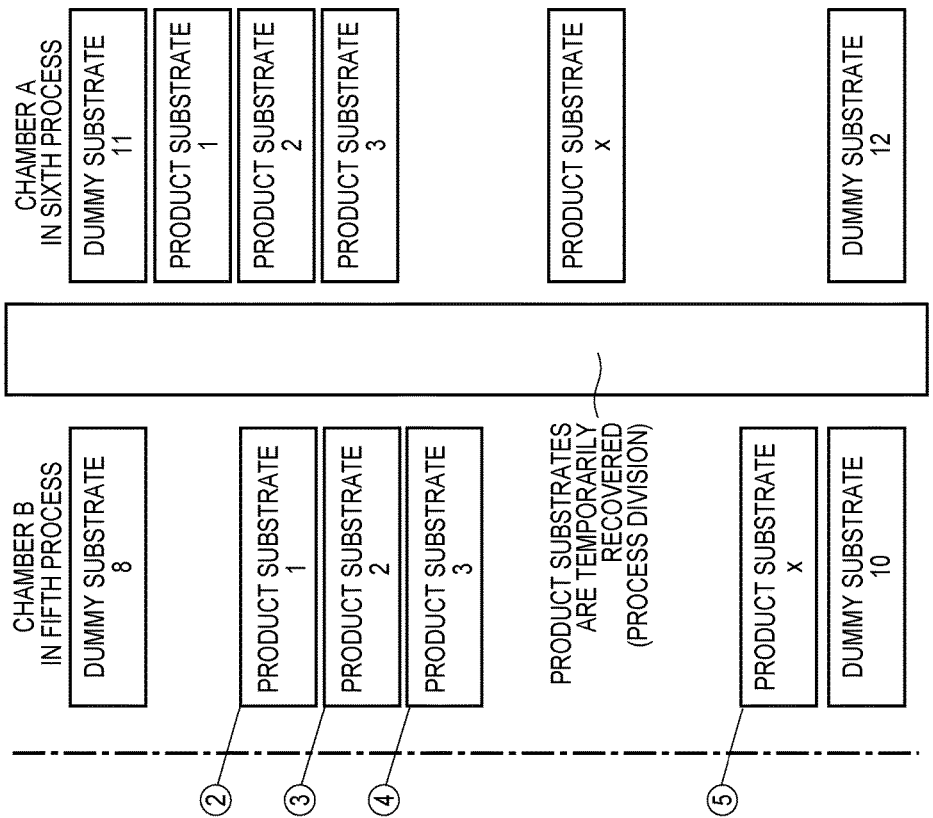

FIGS. 7A and 7B show Examples of product substrate processing, dummy substrate processing, and process division when product substrates are processed in each chamber in the order of chamber A→chamber B→chamber C→chamber A→chamber B→chamber A. This Example provides an example in which return processing is executed a plurality of times.

At the start of product substrate processing, a main control unit CON performs the process division determination processing shown in FIG. 3 to calculate a process division position. In this Example, with this process division determination processing, the process is divided in the intervals between two sets of processes, that is, the interval between the third and fourth processes, and that between the fifth and sixth processes, as shown in FIGS. 7A and 7B. After calculating process division positions, the main control unit CON advances substrate processing in the same way as described above. In this manner, even if return processing is executed a plurality of times, it is possible to calculate a plurality of process division positions and advance substrate processing.

In the above-mentioned Examples, product substrates processed halfway are returned to the original positions in the load ports 41 to 43 shown in FIG. 1. However, when the load lock chamber 21 or 22 shown in FIG. 1 can store a plurality of substrates, the product substrates can be returned to the load lock chamber 21 or 22 (corresponding to the retraction chamber in this Example) shown in FIG. 1, instead of returning them to the original positions in the load ports 41 to 43 shown in FIG. 1. At this time, dummy substrates are transported to chambers via the load lock chamber 21 or 22 shown in FIG. 1, which stores no product substrates. At this time, the product substrates can be processed without being exposed to the atmospheric pressure halfway through the process.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A substrate processing method of using a substrate processing apparatus including at least a first processing chamber, a second processing chamber, and a retraction chamber to execute, for a plurality of substrates, a series of processing including first processing of processing a substrate in the first processing chamber, second processing of processing the substrate in the second processing chamber after the first processing, and third processing of performing processing, different from the first processing, for the substrate in the first processing chamber after the second processing, comprising:

a first execution step of executing the first processing for the plurality of substrates, and executing the second processing for the substrates having undergone the first processing;

a process division determination step of storing information on a number of times of use of each of the first processing chamber and the second processing chamber, and determining, based on the information on the number of times of use, whether or not the first processing in the first processing chamber and the second processing in the second processing chamber have been completed for all of the plurality of substrates;

a recovery step of recovering the plurality of substrates having undergone the first processing and the second processing to the retraction chamber based on a determination result in the process division determination step using the information on the number of times of use;

a conditioning step of, after completion of the first processing and the second processing for the last substrate among the plurality of substrates based on the determination result, loading a dummy substrate into the first processing chamber, executing the third processing for the dummy substrate, and unloading the dummy substrate from the first processing chamber; and a second execution step of, after the dummy substrate is unloaded from the first processing chamber in the conditioning step, loading the substrates recovered in the recovery step into the first processing chamber, and executing the third processing for the substrates loaded into the first processing chamber.

2. The method according to claim 1, further comprising:

an input step of accepting input of transport order information which specifies an order in which the substrates are transported into a plurality of processing chambers to process the substrates in the plurality of processing chambers, and processing condition information which specifies a substrate processing condition in each of the plurality of processing chambers; and a generation step of generating process route information which specifies a substrate transport route, including a recovery process of retracting the substrates into the retraction chamber in the series of processing, from the transport order information and the processing condition information which are accepted in the input step, wherein in the recovery step, processing of recovering the substrates into the retraction chamber is executed in accordance with the process route information generated in the generation step.

3. A substrate processing method of using a substrate processing apparatus including at least a first processing chamber, a second processing chamber, and a retraction chamber to execute, for a plurality of substrates, a series of processing including first processing of processing a substrate in the first processing chamber, second processing of processing the substrate in the second processing chamber after the first processing, and third processing of performing processing, different from the first processing, for the substrate in the first processing chamber after the second processing, comprising:

- an input step of accepting input of transport order information which specifies an order in which the substrates are transported into a plurality of processing chambers to process the substrates in the plurality of processing chambers, and processing condition information which specifies a substrate processing condition in each of the plurality of processing chambers;
- a generation step of generating process route information which specifies a substrate transport route, including a recovery process of retracting the substrates into the retraction chamber in the series of processing, from the transport order information and the processing condition information which are accepted in the input step,
- a first execution step of executing the first processing for the plurality of substrates, and executing the second processing for the substrates having undergone the first processing;
- a recovery step of recovering the plurality of substrates having undergone the first processing and the second processing to the retraction chamber;
- a conditioning step of, after completion of the first processing for the last substrate among the plurality of substrates, loading a dummy substrate into the first processing chamber, executing the third processing for the dummy substrate, and unloading the dummy substrate from the first processing chamber; and
- a second execution step of, after the dummy substrate is unloaded from the first processing chamber in the conditioning step, loading the substrates recovered in the recovery step into the first processing chamber, and executing the third processing for the substrates loaded into the first processing chamber,
- wherein in the recovery step, processing of recovering the substrates into the retraction chamber is executed in accordance with the process route information generated in the generation step.

* * * * *